(12) United States Patent
Kano et al.

(10) Patent No.: US 6,836,496 B1
(45) Date of Patent: Dec. 28, 2004

(54) SEMICONDUCTOR LASER DEVICE

(75) Inventors: Takashi Kano, Hirakata (JP); Hiroki Ohbo, Hirakata (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/532,775

(22) Filed: Mar. 22, 2000

(30) Foreign Application Priority Data

Mar. 24, 1999  (JP) .......................................... 11-079471

(51) Int. Cl.[7] .............................................. H01S 5/00
(52) U.S. Cl. .......................... 372/43; 372/46; 438/478; 257/94
(58) Field of Search ....................... 372/43, 46; 438/46, 438/478; 257/94, 103

(56) References Cited

U.S. PATENT DOCUMENTS

| | | | | |
|---|---|---|---|---|
| 5,966,396 A | * | 10/1999 | Okazaki et al. | ................ 372/46 |
| 6,087,681 A | * | 7/2000 | Shakuda | ..................... 257/103 |
| 6,111,273 A | * | 8/2000 | Kawai | .......................... 257/94 |
| 6,185,238 B1 | * | 2/2001 | Onomura et al. | ............. 372/46 |
| 6,242,761 B1 | * | 6/2001 | Fujimoto et al. | ............. 257/94 |
| 6,265,287 B1 | * | 7/2001 | Tsujimura et al. | ........... 438/478 |
| 6,319,742 B1 | * | 11/2001 | Hayashi et al. | ................ 438/46 |
| 6,359,292 B1 | * | 3/2002 | Sugawara et al. | ........... 257/103 |

FOREIGN PATENT DOCUMENTS

| | | |
|---|---|---|
| JP | 09246670 A | 9/1997 |
| JP | 09307190 A | 11/1997 |
| JP | 11168257 A | 6/1999 |

OTHER PUBLICATIONS

T. Asano et al.; "CW Operation of AlGaInN–GaN Laser Diodes"; *Physica Status Solidi (a)*; vol. 176, No. 1 (Nov. 1999); pp. 23–30.

S. Nunoue et al.; "Reactive Ion Beam Etching and Overgrowth Process in the Fabrication of InGaN Inner Stripe Laser Diodes"; *Japan Journal Applied Physics*; vol. 37 (Mar. 1998); pp. 1470–1473.

* cited by examiner

*Primary Examiner*—James Vannucci
*Assistant Examiner*—Jimmy T. Vu
(74) *Attorney, Agent, or Firm*—Armstrong, Kratz, Quintos, Hanson & Brooks, LLP

(57) ABSTRACT

An n-current blocking layer is formed by alternately stacking an n-first current blocking layer of a nitride based semiconductor containing Al or B and an n-second current blocking layer of a nitride based semiconductor containing In. In a semiconductor laser device having a real refractive index guided structure, the mean refractive index of the n-current block layer is smaller than the refractive indices of a p-first cladding layer and a p-second cladding layer. In a semiconductor laser device having a loss guided structure, the mean band gap of the n-current blocking layer is substantially equal to or smaller than the mean band gap of an active layer.

18 Claims, 6 Drawing Sheets

SEMICONDUCTOR LASER DEVICE

BACKGROUND OF THE INVENTION

1. Field of the Invention

The present invention relates to a semiconductor laser device made of a group III-V nitride based semiconductor (hereinafter referred to as a nitride based semiconductor) such as BN (boron nitride), GaN (gallium nitride), AlN (aluminum nitride), InN (indium nitride) or TlN (thallium nitride) or mixed crystals thereof.

2. Description of the Prior Art

In recent years, GaN based semiconductor light emitting devices are increasingly put into practice as semiconductor laser devices emitting blue or violet light. Such semiconductor laser devices are generally employed as the light sources for optical disk systems writing and reading information in and from an optical disk among optical memories optically writing or reading information. In particular, GaN based semiconductor laser devices are expected as the light sources for high-density optical disk systems such as advanced digital video disks.

FIG. 12 is a typical sectional view of a conventional GaN based semiconductor laser device. Referring to FIG. 12, an undoped GaN low-temperature buffer layer 52, an undoped GaN layer 53, an n-GaN layer 54, an n-anti-cracking layer 55, an n-AlGaN cladding layer 56, an n-GaN light guide layer 57 and an InGaN multiple quantum well (MQW) active layer 58 are successively provided on a sapphire substrate 51.

Further, a p-AlGaN carrier blocking layer 59, a p-GaN light guide layer 60 and a p-AlGaN first cladding layer 61 are successively provided on the active layer 58. An n-GaN current blocking layer 62 having a striped opening 63 is formed on the p-AlGaN first cladding layer 61. A p-AlGaN second cladding layer 64 and a p-GaN contact layer 65 are successively provided on the p-AlGaN first cladding layer 61 located in the striped opening 63 and the n-GaN current blocking layer 62.

Partial regions of the layers from the p-GaN contact layer 65 to the n-GaN layer 54 are removed by etching, to expose the n-GaN layer 54. A p type electrode 66 is formed on the upper surface of the p-GaN contact layer 65, and an n type electrode 67 is formed on the exposed upper surface of the n-GaN layer 54.

In the semiconductor laser device shown in FIG. 12, electrons (negative carriers) supplied from the n type electrode 67 are injected into the active layer 58 through the n-GaN layer 54, the n-anti-cracking layer 55, the n-AlGaN cladding layer 56 and the n-GaN light guide layer 57. Holes (positive carriers) supplied from the p type electrode 66 are injected into the active layer 58 through the p-GaN contact layer 65, the p-AlGaN second cladding layer 64, the p-AlGaN first cladding layer 61, the p-GaN light guide layer 60 and the p-AlGaN carrier blocking layer 59.

The n-GaN current blocking layer 62 having the striped opening 63 is provided in order to reduce operating current and limit an emission spot position by limiting the flow of current in a striped manner. The n-GaN current blocking layer 62 limits the current flowing into the active layer 58 substantially to the region located under the striped opening 63.

In the aforementioned conventional semiconductor laser device, however, the n-GaN current blocking layer 62, having a larger refractive index as compared with the p-AlGaN first cladding layer 61 and the p-AlGaN second cladding layer 64, has no effect of light confinement.

In order to bring the semiconductor laser device into a real refractive index guided structure for attaining the effect of light confinement, the n-current blocking layer must be made of n-AlGaN, for example, in a larger Al composition ratio than the p-AlGaN first cladding layer 61 and the p-AlGaN second cladding layer 64 so that the refractive index thereof is smaller than those of the p-AlGaN first cladding layer 61 and the p-AlGaN second cladding layer 64. Thus, the effective refractive index in the region of the active layer 58 located under the n-current blocking layer is smaller than that of the region of the active layer 58 located under the p-AlGaN second cladding layer 64 in the striped opening 63. Consequently, light is confined in the central portion of the active layer 58. In this case, however, the p-AlGaN first cladding layer 61 and the p-AlGaN second cladding layer 64, which are also made of n-AlGaN, and the n-AlGaN current blocking layer provide a large AlGaN film thickness in total. Such a film having a large Al composition is readily cracked if the thickness thereof is too large.

SUMMARY OF THE INVENTION

An object of the present invention is to provide a semiconductor laser device having a current blocking layer, which is excellent in thermal stability and prevented from cracking.

Another object of the present invention is to provide a semiconductor laser device having a current blocking layer, which is excellent in thermal stability, prevented from cracking and improved in effect of light confinement.

A semiconductor laser device according to an aspect of the present invention comprises a first nitride based semiconductor layer including an active layer and containing at least one of boron, aluminum, gallium, indium and thallium, a current blocking layer, formed on the first nitride based semiconductor layer, having a striped opening, and a second nitride based semiconductor layer, formed on the first nitride based semiconductor layer in the striped opening, containing at least one of boron, aluminum, gallium, indium and thallium, and the current blocking layer includes a multi-layer structure of at least one first layer of a nitride based semiconductor containing at least one of aluminum and boron and at least one second layer of a nitride based semiconductor containing indium and having a smaller band gap than the first layer.

In this semiconductor laser device, the first layer of the current blocking layer contains at least one of boron and aluminum, whereby the band gap of the first layer can be increased for reducing the refractive index of the first layer. Thus, in the case of a real refractive index guided structure, the difference in refractive index between the current blocking layer and the second nitride based semiconductor layer in the striped opening can be increased. Further, the first layer of the current blocking layer containing at least one of boron and aluminum is thermally stabilized. In addition, the second layer of the current blocking layer containing indium can absorb strain caused in the first layer containing boron or aluminum. Thus, cracking is suppressed.

Therefore, a semiconductor laser device having a real refractive index guided structure excellent in thermal stability, prevented from cracking and improved in effect of light confinement is implemented. Alternatively, a semiconductor laser device having a loss guided structure excellent in thermal stability and prevented from cracking is implemented.

At least one first layer may have a larger aluminum composition ratio than that of at least one second layer or a larger boron composition ratio than that of at least one second layer, and at least one second layer may have a larger indium composition ratio than that of at least one first layer.

In this case, at least one first layer is reduced in refractive index and improved in thermal stability. Further, at least one second layer absorbs strain of at least one first layer.

The first nitride based semiconductor layer may include a first conductivity type cladding layer, the active layer and a second conductivity type first cladding layer in this order, and the second nitride based semiconductor layer may include a second conductivity type second cladding layer.

At least one first layer may include at least two first layers, and at least two first layers and at least one second layer may be alternately stacked.

In this case, the second layer held between the first layers effectively absorbs strain caused in the first layers arranged on both sides thereof.

The mean refractive index of the current blocking layer may be smaller than the refractive index of the second nitride based semiconductor layer in the striped opening. In this case, the effective refractive index in the region of the active layer located under the current blocking layer is smaller than the effective refractive index in the region of the active layer located under the striped opening, and light is concentrated to the region of the active layer located under the striped opening. Thus, a semiconductor laser device having a real refractive index guided structure is implemented.

The mean band gap of the current blocking layer may be larger than the band gap of the second conductivity type second cladding layer. In this case, the mean refractive index of the current blocking layer is smaller than the refractive index of the second conductivity type second cladding layer in the striped opening. Thus, the effective refractive index in the region of the active layer located under the current blocking layer is smaller than the effective refractive index in the region of the active layer located under the second conductivity type second cladding layer in the striped opening, and light is concentrated to the region of the active layer located under the striped opening. Consequently, a semiconductor laser device having a real refractive index guided structure is implemented.

The active layer may include at least one quantum well layer and at least two quantum barrier layers alternately stacked, and the band gap of at least one second layer may be larger than the band gap of at least one quantum well layer. In this case, the mean band gap of the current blocking layer can be readily rendered larger than the band gap of the second conductivity type second cladding layer.

The active layer may contain indium, gallium and nitrogen, at least one first layer may contain at least one of aluminum and boron as well as gallium and nitrogen, at least one second layer may contain indium, gallium and nitrogen, and the first conductivity type cladding layer, the second conductivity type first cladding layer and the second conductivity type second cladding layer may contain aluminum, gallium and nitrogen.

At least one first layer may have a larger aluminum composition ratio than that of the second conductivity type second cladding layer or a larger boron composition ratio than that of the second conductivity type second cladding layer. Thus, the band gap of at least one first layer is larger than the band gap of the second conductivity type second cladding layer.

The active layer may include at least one quantum well layer containing indium, gallium and nitrogen and at least two quantum barrier layers containing indium, gallium and nitrogen, alternately stacked, and the indium composition ratio of at least one quantum well layer may be larger than the indium composition ratio of at least two quantum barrier layers.

The mean band gap of the current blocking layer may be substantially equal to or smaller than the band gap of the active layer.

In this case, the current blocking layer absorbs light generated in the region of the active layer located under the current blocking layer, whereby light is concentrated to the region of the active layer located under the striped opening. Thus, a semiconductor laser device having a loss guided structure is implemented.

The active layer may include at least one quantum well layer and at least two quantum barrier layers alternately stacked, and the mean band gap of the current blocking layer may be substantially equal to or smaller than the mean band gap of the active layer. In this case, the current blocking layer absorbs light generated in the active layer having a multiple quantum well structure, whereby light is concentrated to the region of the active layer located under the striped opening.

The band gap of at least one second layer may be smaller than the band gap of at least one quantum well layer. In this case, the mean band gap of the current blocking layer can be readily rendered substantially equal to or smaller than the band gap of the active layer.

The active layer may contain indium, gallium and nitrogen, at least one first layer may contain at least one of aluminum and boron as well as indium, gallium and nitrogen, at least one second layer may contain indium, gallium and nitrogen, and the first conductivity type cladding layer, the second conductivity type first cladding layer and the second conductivity type second cladding layer may contain aluminum, gallium and nitrogen.

The active layer may include at least one quantum well layer containing indium, gallium and nitrogen and at least two quantum barrier layers containing indium, gallium and nitrogen, alternately stacked, and the indium composition ratio of at least one quantum well layer may be larger than the indium composition ratio of at least two quantum barrier layers.

The first nitride based semiconductor layer may further include a first conductivity type light guide layer provided between the first conductivity type cladding layer and the active layer and a second conductivity type light guide layer provided between the active layer and the second conductivity type first cladding layer.

The semiconductor laser device may further comprise a third nitride based semiconductor layer, formed on the current blocking layer and the second nitride based semiconductor layer, containing at least one of boron, aluminum, gallium, indium and thallium.

The third nitride based semiconductor layer may include a third cladding layer of the second conductivity type and a second conductivity type contact layer. Alternatively, the third nitride based semiconductor layer may include a second conductivity type contact layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

(1) First Embodiment

Figure 1:
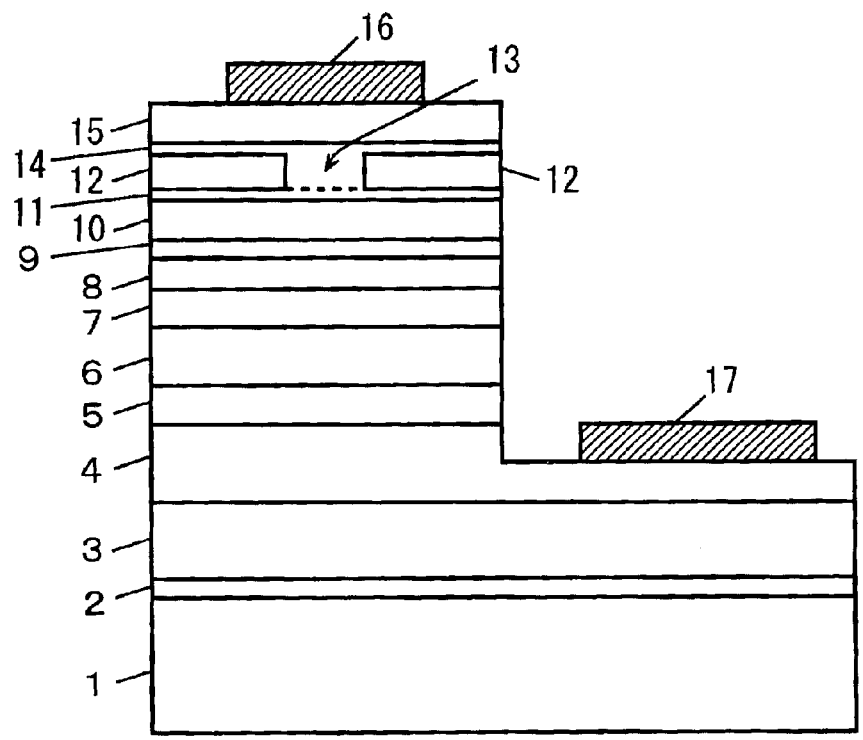
FIG. 1 is a typical sectional view of a GaN based semiconductor laser device according to a first embodiment of the present invention.
Figure 2:
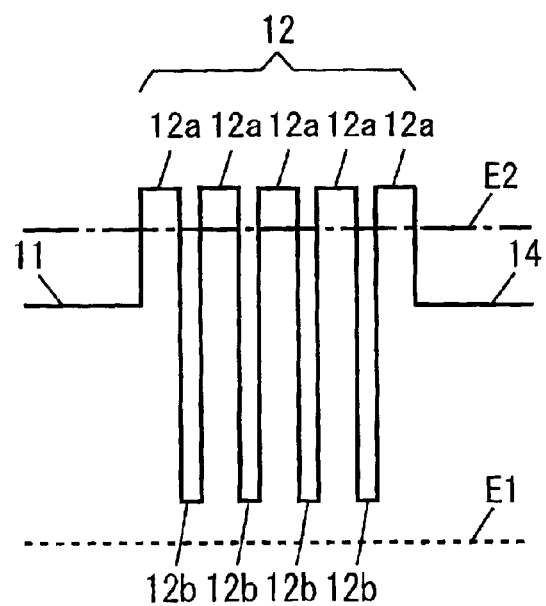
FIG. 2 is an energy band diagram of a current blocking layer of the semiconductor laser device shown in FIG. 1 and the vicinity thereof.

FIG. 1 is a typical sectional view of a GaN semiconductor laser device according to a first embodiment of the present invention. FIG. 2 is an energy band diagram of a current blocking layer of the semiconductor laser device shown in FIG. 1 and the vicinity thereof.

As shown in FIG. 1, a low-temperature buffer layer 2 of undoped BAlGaN having a thickness of 200 Å, an undoped BGaN layer 3 of 4.5 μm in thickness, an n-BGaN layer 4 of 4.5 μm in thickness and an n-anti-cracking layer 5 of 0.25 μm in thickness are successively formed on a sapphire substrate 1. The n-anti-cracking layer 5 is formed by alternately stacking 21 pairs of BAlGaN layers of 60 Å in thickness and GaN layers of 60 Å in thickness.

An n-cladding layer 6 of BAlGaN having a thickness of 0.8 μm and an n-light guide layer 7 of BGaN having a thickness of 0.1 μm are successively formed on the n-anti-cracking layer 5. An n-multiple quantum well active layer (hereinafter referred to as an MQW active layer) 8 of BInGaN is formed on the n-light guide layer 7. The n-MQW active layer 8 has a multiple quantum well structure formed by alternately stacking four BInGaN quantum barrier layers of each having a thickness of 50 Å and three BInGaN quantum well layers each having a thickness of 20 Å.

A p-carrier blocking layer 9 of BAlGaN having a thickness of 200 Å, a p-light guide layer 10 of BGaN having a thickness of 0.1 μm and a p-first cladding layer 11 of BAlGaN having a thickness of 0.2 μm are successively formed on the n-MQW active layer 8. An n-current blocking layer 12 of about 0.5 μm in thickness having a striped opening 13 is formed on the p-first cladding layer 11. A p-second cladding layer 14 of BAlGaN having a thickness of 0.7 μm is formed on the p-first cladding layer 11 located in the striped opening 13 and the n-current blocking layer 12. A p-contact layer 15 of BGaN having a thickness of 0.05 μm is formed on the p-second cladding layer 12. As shown in the energy band diagram of FIG. 2, the n-current blocking layer 12 is formed by alternately stacking five n-first current blocking layers 12a of BAlGaN each having a thickness of 0.1 μm and four n-second current blocking layers 12b of BInGaN each having a thickness of 0.02 μm.

Partial regions of the layers from the p-contact layer to the n-BGaN layer 4 are removed by etching, to expose the n-BGaN layer 4. A p type electrode 16 is formed on the p-contact layer 15, and an n type electrode 17 is formed on the exposed upper surface of the n-BGaN layer 4.

The semiconductor laser device shown in FIG. 1 is formed by MOCVD (metal-organic chemical vapor deposition), for example. Table 1 shows the compositions, thicknesses and growth temperatures of the layers 2 to 12, 14 and 15 of the semiconductor laser device shown in FIG. 1.

TABLE 1

| Name of Layer | Composition | Thickness | Growth Temperature [° C.] |
|---|---|---|---|
| Low-Temperature Buffer Layer | $B_{0.1}Al_{0.4}Ga_{0.5}N$ | 200Å | 600 |
| i-BGaN Layer | $B_{0.02}Ga_{0.98}N$ | 4.5 μm | 1080 |
| n-BGaN Layer | $B_{0.02}Ga_{0.98}N$ | 4.5 μm | 1080 |
| Anti-Cracking Layer | $B_{0.05}Al_{0.02}Ga_{0.93}N$/GaN | 0.25 μm | 1080 |
| n-Cladding Layer | $B_{0.02}Al_{0.05}Ga_{0.93}N$ | 0.8 μm | 1080 |
| n-Light Guide Layer | $B_{0.02}Ga_{0.98}N$ | 0.1 μm | 1080 |
| Quantum Barrier Layer | $B_{0.02}In_{0.05}Ga_{0.93}N$ | 50Å | 800 |
| Quantum Well Layer | $B_{0.02}In_{0.15}Ga_{0.83}N$ | 20Å | 800 |
| p-Carrier Blocking Layer | $B_{0.05}Al_{0.20}Ga_{0.75}N$ | 200Å | 800 |
| p-Light Guide Layer | $B_{0.02}Ga_{0.98}N$ | 0.1 μm | 1080 |
| p-First Cladding Layer | $B_{0.02}Al_{0.05}Ga_{0.93}N$ | 0.2 μm | 1080 |
| n-First Current Blocking Layer | $B_{0.02}Al_{0.07}Ga_{0.91}N$ | 0.1 μm | 1080 |
| n-Second Current Blocking Layer | $B_{0.02}In_{0.08}Ga_{0.90}N$ | 0.02 μm | 800 |
| p-Second Cladding Layer | $B_{0.02}Al_{0.05}Ga_{0.93}N$ | 0.7 μm | 1080 |
| p-Contact Layer | $B_{0.02}Ga_{0.98}N$ | 0.05 μm | 1080 |

Si is employed as an n-type dopant, and Mg is employed as a p-type dopant. As shown in Table 1, the growth temperature of the low-temperature buffer layer 2 is 600° C., and the growth temperatures of the BGaN layer 3, the n-BGaN layer 4, the n-anti-cracking layer 5, the n-cladding layer 6, the n-light guide layer 7, the n-carrier blocking layer 8, the p-light guide layer 10, the p-first cladding layer 11, the n-first current blocking layers 12a and the p-contact layer 15 are 1080° C. The growth temperatures of the n-MWQ active layer 8, the p-carrier blocking layer 9 and the n-second current blocking layers 12b are 800° C.

TMG (trimethyl gallium), TMA (trimethyl aluminum), $NH_3$ and $B_2H_4$ are employed as raw material gases for growing the low-temperature buffer layer 2. TMG, $NH_3$ and $B_2H_4$ are employed as raw material gases for growing the BGaN layer 3. TMG, $NH_3$ and $B_2H_4$ are employed as raw material gases and $SiH_4$ is employed as a dopant gas for growing the n-BGaN layer 4 and the n-light guide layer 7. TMG, TMA, $NH_3$ and $B_2H_4$ are employed as raw material gases and $SiH_4$ is employed as a dopant gas for growing the n-anti-cracking layer 5, the n-cladding layer 6 and the n-first current blocking layers 12a.

TEG (triethyl gallium), TMI (trimethyl indium), $NH_3$ and $B_2H_4$ are employed as raw material gases and $SiH_4$ is employed as a dopant gas for growing the n-MQW active layer 8 and the n-second current blocking layers 12b. TMG, TMA, $NH_3$ and $B_2H_4$ are employed as raw material gases and $Cp_2Mg$ (cyclopentadienyl magnesium) is employed as a dopant gas for growing the p-carrier blocking layer 9, the p-first cladding layer 11 and the p-second cladding layer 14. TMG, $NH_3$ and $B_2H_4$ are employed as raw material gases and $Cp_2Mg$ is employed as a dopant gas for growing the p-light guide layer 10 and the p-contact layer 15.

The refractive index of the n-MQW active layer 8 is higher than those of the n-cladding layer 6 and the p-cladding layer 12, and the refractive indices of the n-light guide layer 7 and the p-light guide layer 10 are lower than that of the n-MQW active layer 8 and higher than those of the n-cladding layer 6, the p-first cladding layer 11 and the p-second cladding layer 14.

As understood from FIG. 2, the band gap of the n-first current blocking layers 12a is larger than that of the p-first cladding layer 11 and the p-second cladding layer 14. However, the band gap of the n-second current blocking layers 12b, which is smaller than that of the n-first current blocking layers 12a as well as those of the p-first cladding layer 11 and the p-second cladding layer 14, is larger than that of the quantum well layers (energy level E1 on the lower end of the conduction band) forming the MQW active layer 8. The mean energy level E2 of the n-first current blocking layers 12a and the n-second current blocking layers 12b on the lower end of the conduction band is set higher than the energy level of the p-first cladding layer 11 and the p-second cladding layer 14 on the lower end of the conduction band.

In the semiconductor laser device according to this embodiment, the layers from the p-first cladding layer 11 to the p-second cladding layer 14, including the n-first current blocking layers 12a, are prepared by adding at least one of B and Al to GaN, and the total thickness of these layers is about 0.9 $\mu$m. However, the n-second current blocking layers 12b of n-BInGaN having a smaller band gap than the n-first current blocking layers 12a of n-BAlGaN are held between the n-first current blocking layers 12a for effectively absorbing strain caused in the n-first current blocking layers 12a arranged on both sides thereof, thereby preventing cracking. In particular, the n-second current blocking layers 12b containing indium attain a large anti-cracking effect.

The mean energy level E2 of the n-current blocking layer 12 formed by the five n-first current blocking layers 12a and the four n-second current blocking layers 12b on the lower end of the conduction band is set higher than the energy level of the n-first cladding layer 11 and the p-second cladding layer 14 on the lower end of the conduction band, whereby the mean refractive index of the n-current blocking layer 12 is smaller than the refractive indices of the p-first cladding layer 11 and the p-second cladding layer 14. Thus, the effective refractive index in the region of the MQW active layer 8 located under the striped opening 13 is larger than that in the region of the MQW active layer 8 located under the n-current blocking layer 12, and an effect of concentrating light to the region located under the striped opening 13 can be increased. Thus, semiconductor laser device having a real refractive index guided structure is implemented.

The total thickness of the four n-second current blocking layers 12b having a low energy level on the lower end of the conduction band is 0.08 $\mu$m. The thickness of each n-first current blocking layer 12a having a high energy level on the lower end of the conduction band is 0.1 $\mu$m, and the total thickness of the five n-first current blocking layers 12a is 0.5 $\mu$m. Thus, the mean energy level E2 of the current blocking layer 12 on the lower end of the conduction band can be controlled higher than the energy level of the p-first cladding layer 11 and the p-second cladding layer 14 on the lower end of the conduction band by setting the thickness of the n-first current blocking layers 12a larger than that of the n-second current blocking layers 12b.

(2) Second Embodiment

Figure 3:
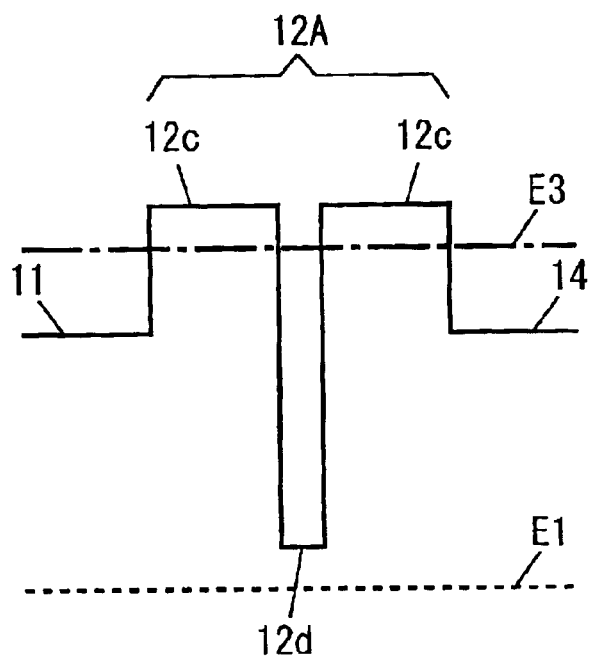
FIG. 3 is an energy band diagram of a current blocking layer of a GaN based semiconductor laser device according to a second embodiment of the present invention and the vicinity thereof.

FIG. 3 is an energy band diagram of a current blocking layer 12A of a GaN based semiconductor laser device according to a second embodiment of the present invention and the vicinity thereof. The semiconductor laser device shown in FIG. 3 is different from that shown in FIG. 1 in a point that the n-current blocking layer 12A has three layers while the n-current blocking layer 12 has nine layers. The structures of the remaining parts of the semiconductor laser device shown in FIG. 3 and a method of manufacturing the same are similar to those of the semiconductor laser device shown in FIG. 1.

As shown in the energy band diagram of FIG. 3, the n-current blocking layer 12A formed on a p-first cladding layer 11 of p-BAlGaN is formed by alternately stacking two n-first current blocking layers 12c of BAlGaN each having a thickness of 0.25 $\mu$m and an n-second current blocking layer 12d of BInGaN having a thickness of 0.05 $\mu$m.

The n-first current blocking layers 12a shown in FIG. 2 and the n-first current blocking layers 12c shown in FIG. 3 as well as the n-second current blocking layers 12b shown in FIG. 2 and the n-second current blocking layer 12d shown in FIG. 3 are identical in composition and growth condition to each other, except the thicknesses.

The compositions, thicknesses and growth conditions of respective layers forming the semiconductor laser device shown in FIG. 3, excluding the n-current blocking layer 12A, are similar to those of the layers 2 to 11, 14 and 15 forming the semiconductor laser device shown in FIG. 1. The energy level of the n-first current blocking layers 12c on the lower end of the conduction band is identical to that of the n-first current blocking layers 12a on the lower end of the conduction band, and the energy level of the n-second current blocking layer 12d on the lower end of the conduction band is identical to that of the n-second current blocking layers 12b on the lower end of the conduction band. The mean energy level E3 of the n-current blocking layer 12A on the lower end of the conduction band is set higher than that of the p-first cladding layer 11 and the p-second cladding layer 14 on the lower end of the conduction band.

In the semiconductor laser device according to this embodiment having the aforementioned structure, an effect of light confinement by the n-current blocking layer 12A can be improved while the p-first cladding layer 11, the n-current blocking layer 12A and the p-second cladding layer 14 are hardly cracked similarly to the semiconductor laser device according to the first embodiment. Further, thermal stability is improved due to the n-first current blocking layers 12c containing boron and aluminum.

(3) Third Embodiment

Figure 4:
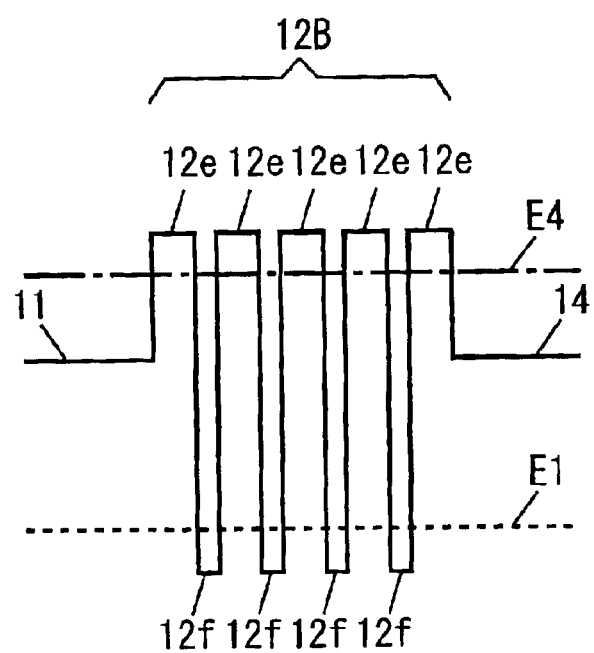
FIG. 4 is an energy band diagram of a current blocking layer of a GaN based semiconductor laser device according to a third embodiment of the present invention and the vicinity thereof.

FIG. 4 is an energy band diagram of a current blocking layer 12B of a GaN based semiconductor laser device according to a third embodiment of the present invention and the vicinity thereof. The semiconductor laser device shown in FIG. 4 is different from that shown in FIG. 1 in a point that the n-current blocking layer 12B has a different composition different from then-current blocking layer 12. The structures of the remaining parts of the semiconductor laser device shown in FIG. 4 and a method of manufacturing the same are identical to those of the semiconductor laser device shown in FIG. 1.

As shown in the energy band diagram of FIG. 4, the n-current blocking layer 12B formed on a first cladding layer 11 of p-BAlGaN is formed by alternately stacking five first current blocking layers 12e of n-BAlGaN each having a thickness of 0.1 μm and four n-BInGaN second current blocking layers 12f each having a thickness of 0.01 μm.

Table 2 shows the compositions, thicknesses and growth temperatures of partial layers related to the semiconductor laser device shown in FIG. 4. The compositions, thicknesses and growth temperatures of the layers, excluding the n-current blocking layer 12B, are similar to those of the layers 2 to 12, 14 and 15 of the semiconductor laser device shown in FIG. 1 (Table 1).

TABLE 2

| Name of Layer | Composition | Thickness | Growth Temperature [° C.] |
|---|---|---|---|
| Quantum Barrier Layer | $B_{0.02}In_{0.05}Ga_{0.93}N$ | 50Å | 800 |
| Quantum Well Layer | $B_{0.02}In_{0.15}Ga_{0.83}N$ | 20Å | 800 |
| p-First Cladding Layer | $B_{0.02}Al_{0.05}Ga_{0.93}N$ | 0.2 μm | 1080 |
| n-First Current Blocking Layer | $B_{0.02}Al_{0.07}Ga_{0.91}N$ | 0.1 μm | 1080 |
| n-Second Current Blocking Layer | $B_{0.02}In_{0.18}Ga_{0.80}N$ | 0.01 μm | 800 |
| p-Second Cladding Layer | $B_{0.02}Al_{0.05}Ga_{0.93}N$ | 0.7 μm | 1080 |

As understood from FIG. 4, the band gap of the n-first current blocking layers 12e is larger than that of the p-first cladding layer 11 and a p-second cladding layer 14. On the other hand, the band gap of the n-second current blocking layers 12f is smaller than that of quantum well layers forming an MQW active layer 8. The mean energy level E4 of the n-first current blocking layers 12e and the n-second current blocking layers 12f on the lower end of the conduction band is set higher than the energy level of the p-first cladding layer 11 and the p-second cladding layer 14 on the lower end of the conduction band.

In the semiconductor laser device according to this embodiment, the n-second current blocking layers 12f of n-BInGaN having a smaller band gap than the n-first current blocking layers 12e of n-BAlGaN are held between the n-first current blocking layers 12e, for increasing an effect of preventing cracking. Particularly as compared with the first embodiment, the composition ratio of indium in the n-BInGaN second current blocking layers 12f is larger than that in the n-BInGaN second current blocking layers 12b, for more effectively preventing cracking.

The thermal stability of the n-current blocking layer 12B is improved due to the n-first current blocking layers 12e containing aluminum and boron. Further, the mean energy level E4 of the n-first current blocking layers 12e and the n-second current blocking layers 12f on the lower end of the conduction band is higher than the energy level of the p-first cladding layer 11 and the p-second cladding layer 14 on the lower end of the conduction band, whereby the mean refractive index of the n-current blocking layer 12B is smaller than those of the p-first cladding layer 11 and the p-second cladding layer 14 so that light is concentrated to a region of the MQW active layer 8 located under a striped opening 13 of the n-current blocking layer 12B and an effect of light confinement is improved. As compared with the first embodiment, however, the band gap of the n-second current blocking layers 12f of n-BInGaN is smaller than that of the n-second current blocking layers 12b of n-BInGaN, and hence it is easier to control the mean energy level of the n-current blocking layer 12 on the lower end of the conduction band in the semiconductor laser device according to the first embodiment.

(4) Fourth Embodiment

Figure 5:
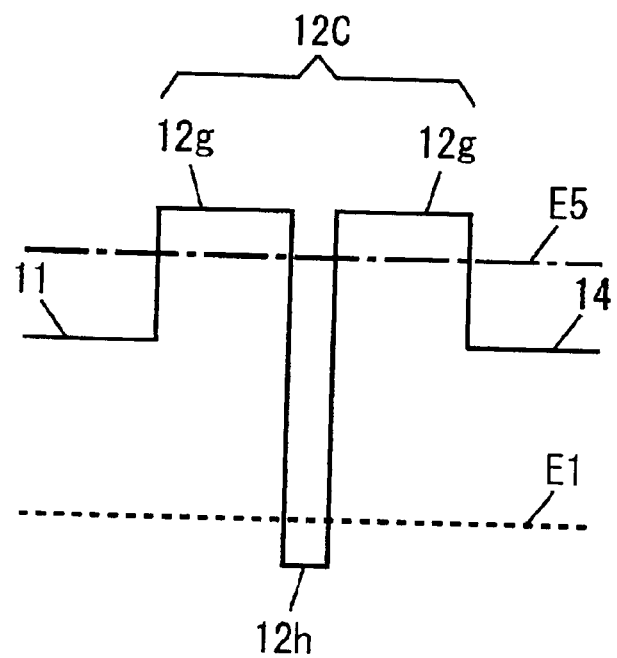
FIG. 5 is an energy band diagram of a current blocking layer of a GaN based semiconductor laser device according to a fourth embodiment of the present invention and the vicinity thereof.

FIG. 5 is an energy band diagram of a current blocking layer of 12C a GaN based semiconductor laser device according to a fourth embodiment of the present invention and the vicinity thereof.

The semiconductor laser device shown in FIG. 5 is different from that shown in FIG. 4 in a point that the n-current blocking layer 12C has three layers while the n-current blocking layer 12B has nine layers. The structures of the remaining parts of the semiconductor laser device shown in FIG. 5 and a method of manufacturing the same are identical to those of the semiconductor laser device shown in FIG. 3, i.e., those of the semiconductor laser device shown in FIG. 1.

As shown in the energy band diagram of FIG. 5, the n-current blocking layer 12C formed on a p-first cladding layer 11 of p-BAlGaN is formed by alternately stacking two n-first current blocking layers 12g of BAlGaN each having a thickness of 0.025 μm and an n-second current blocking layer 12h of BInGaN having a thickness of 0.05 μm. The n-first current blocking layers 12e shown in FIG. 4 and the n-first current blocking layers 12g shown in FIG. 5 as well as the n-second current blocking layers 12f shown in FIG. 4 and the n-second current blocking layer 12h shown in FIG. 5 are identical in composition and growth condition to each other, except the thicknesses. The compositions, thicknesses and growth temperatures of layers forming the semiconductor laser device shown in FIG. 5, excluding the n-current blocking layer 12C, are similar to those of the layers forming the semiconductor laser device shown in FIG. 4, i.e., those of the layers 2 to 12, 14 and 15 of the semiconductor laser device shown in FIG. 1.

The band gap of the n-first current blocking layers 12g of BAlGaN is equivalent to that of the n-first current blocking layers 12e of BAlGaN, and the band gap of the n-second current blocking layer 12h of BInGaN is equivalent to that of the n-second current blocking layers 12f of BInGaN. The mean energy level E5 of the n-current blocking layer 12C on the lower end of the conduction band is set higher than the energy level of the p-first cladding layer 11 and a p-second cladding layer 14 on the lower end of the conduction band.

In the semiconductor laser device according to the fourth embodiment having the aforementioned structure, an effect of light confinement by the n-current blocking layer 12C and thermal stability can be improved while the p-first cladding layer 11, the n-current blocking layer 12C and the p-second cladding layer 14 are hardly cracked, similarly to the semiconductor laser device according to the third embodiment.

(5) Fifth Embodiment

Figure 6:
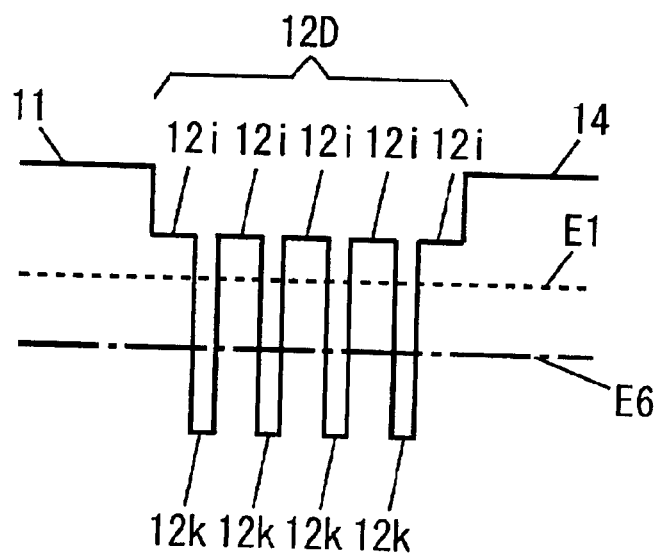
FIG. 6 is an energy band diagram of a current blocking layer of a GaN based semiconductor laser device according to a fifth embodiment of the present invention and the vicinity thereof.

FIG. 6 is an energy band diagram of a current blocking layer 12D of a GaN based semiconductor laser device according to a fifth embodiment of the present invention and the vicinity thereof.

The semiconductor laser device shown in FIG. 6 is different from that shown in FIG. 1 in a point that the composition of the n-current blocking layer 12D is different from that of the n-current blocking layer 12. The structures of the remaining parts of the semiconductor laser device shown in FIG. 6, excluding the n-current blocking layer 12D, and a method of manufacturing the same are identical to those of the semiconductor laser device shown in FIG. 1.

As shown in the energy band diagram of FIG. 6, the n-current blocking layer 12D formed on a p-first cladding layer 11 of BAlGaN is prepared by alternately stacking five n-first current blocking layers 12$i$ of BAlInGaN each having a thickness of 0.1 μm and four n-second current blocking layers 12$k$ of BInGaN each having a thickness of 0.01 μm.

Table 3 shows the compositions, thicknesses and growth temperatures of partial layers related to the semiconductor laser device shown in FIG. 6. The compositions, thicknesses and growth temperatures of the layers, excluding the n-current blocking layer 12D, are similar to those of the layers 2 to 12, 14 and 15 of the semiconductor laser device shown in FIG. 1 (Table 1).

TABLE 3

| Name of Layer | Composition | Thickness | Growth Temperature [° C.] |
| --- | --- | --- | --- |
| Quantum Barrier Layer | $B_{0.02}In_{0.05}Ga_{0.93}N$ | 50Å | 800 |
| Quantum Well Layer | $B_{0.02}In_{0.15}Ga_{0.83}N$ | 20Å | 800 |
| p-First Cladding Layer | $B_{0.02}Al_{0.05}Ga_{0.93}N$ | 0.2 μm | 1080 |
| n-First Current Blocking Layer | $B_{0.02}Al_{0.02}In_{0.08}Ga_{0.88}N$ | 0.1 μm | 800 |
| n-Second Current Blocking Layer | $B_{0.02}In_{0.18}Ga_{0.80}N$— $B_{0.02}In_{0.20}Ga_{0.78}N$ | 0.01 μm | 800 |
| p-Second Cladding Layer | $B_{0.02}al_{0.05}Ga_{0.93}N$ | 0.7 μm | 1080 |

As shown in FIG. 6, the band gap of the n-second current blocking layers 12$k$ of BInGaN is smaller than that of quantum well layers forming an MQW active layer B. The band gap of the n-first current blocking layers 12$i$ of BAlInGaN is substantially identical to or smaller than that of quantum barrier layers forming the MQW active layer 8. Therefore, the mean energy level E6 of the n-current blocking layer 12D on the lower end of the conduction band is set substantially identical to or not more than the mean energy level E1 of the MQW active layer 8 on the lower end of the conduction band.

In the semiconductor laser device according to this embodiment, the total thickness of the layers prepared by adding at least one of Al and B to GaN is 0.9 μm, while the n-second current blocking layers 12$k$ of BInGaN having a smaller band gap than the n-first current blocking layers 12$i$ of BAlInGaN are held between the n-first current blocking layers 12$i$ of BAlInGaN, whereby cracking can be prevented while improving thermal stability of the n-current blocking layer 12D.

In this case, the mean energy level E6 of the n-current blocking layer 12D formed by the five n-first current blocking layers 12$i$ and the four n-second current blocking layers 12$k$ on the lower end of the conduction band is set lower than the mean energy level E1 of the MQW active layer 8 on the lower end of the conduction band, whereby the n-current blocking layer 12D absorbs light generated in the region of the active layer 8 located under the n-current blocking layer 12D so that light is concentrated to the region of the active layer 8 located under a striped opening 13 of the n-current blocking layer 12D. Thus, a semiconductor laser device having a loss guided structure is obtained.

The mean energy level E6 of the n-current blocking layer 12D on the lower end of the conduction band can be controlled smaller than the mean energy level E1 of the active layer 8 on the lower end of the conduction band by employing a material having a smaller band gap than that of the quantum well layers forming the MQW active layer 8 for the n-second current blocking layers 12$k$.

(6) Sixth Embodiment

Figure 7:
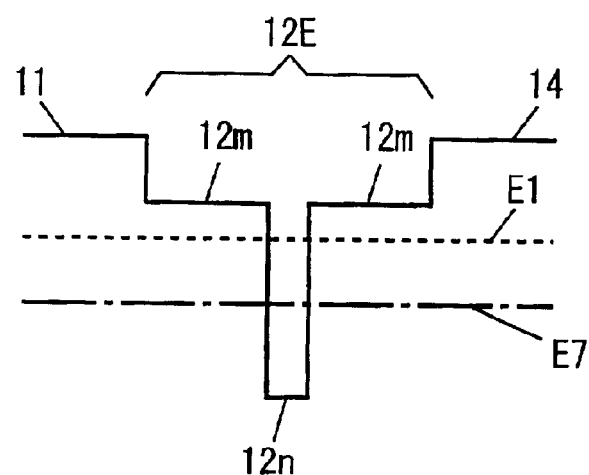
FIG. 7 is an energy band diagram of a current blocking layer of a GaN based semiconductor laser device according to a sixth embodiment of the present invention and the vicinity thereof.

FIG. 7 is an energy band diagram of a current blocking layer of a GaN based semiconductor laser device according to a sixth embodiment of the present invention and the vicinity thereof. The semiconductor laser device shown in FIG. 7 is different from that shown in FIG. 6 in a point that an n-current blocking layer 12E has a three stacked layers while the n-current blocking layer 12D has nine stacked layers. The structures of the remaining parts of the semiconductor laser device shown in FIG. 7 and a method of manufacturing the same are identical to those of the semiconductor laser device shown in FIG. 6, i.e., those of the semiconductor laser device shown in FIG. 1.

As shown in FIG. 7, the n-current blocking layer 12E formed on a p-first cladding layer 11 of p-BAlGaN is prepared by alternately stacking two n-first current blocking layers 12$m$ of BAlInGaN each having a thickness of 0.25 μm and an n-second current blocking layer 12$n$ of BInGaN having a thickness of 0.05 μm. The n-first current blocking layers 12$m$ shown in FIG. 7 and the n-first current blocking layers 12$i$ shown in FIG. 6 as well as the n-second current blocking layer 12$n$ shown in FIG. 7 and the n-second current blocking layers 12$k$ shown in FIG. 6 are identical in composition and growth temperature to each other, except the thicknesses. The compositions, thicknesses and growth temperatures of layers forming the semiconductor laser device shown in FIG. 7, excluding the n-current blocking layer 12E, are similar to those of the layers forming the semiconductor laser device shown in FIG. 6, i.e., those of the layers 2 to 12, 14 and 15 of the semiconductor laser device shown in FIG. 1.

The band gap of the n-first current blocking layers 12$m$ of BAlInGaN is equivalent to that of the n-first current blocking layers 12$i$ of BAlInGaN, and the band gap of the n-second current blocking layer 12$n$ of BInGaN is equivalent to that of the n-second current blocking layers 12$k$ of BInGaN. The mean energy level E7 of the n-current blocking layer 12E on the lower end of the conduction band is set substantially identical to or lower than the mean energy level E1 of an MQW active layer 8 on the lower end of the conduction band.

In the semiconductor laser device according to this embodiment having the aforementioned structure, the thermal stability of the n-current blocking layer 12E can be improved by increasing the composition ratio of at least either aluminum or boron, similarly to the semiconductor laser device according to the fifth embodiment. At the same time, the n-second current blocking layer 12n of BInGaN is held between the n-first current blocking layers 12m, whereby the p-first cladding layer 11, the n-current blocking layer 12E and a p-second cladding layer 14 are hardly cracked.

(7) Seventh Embodiment

Figure 8:
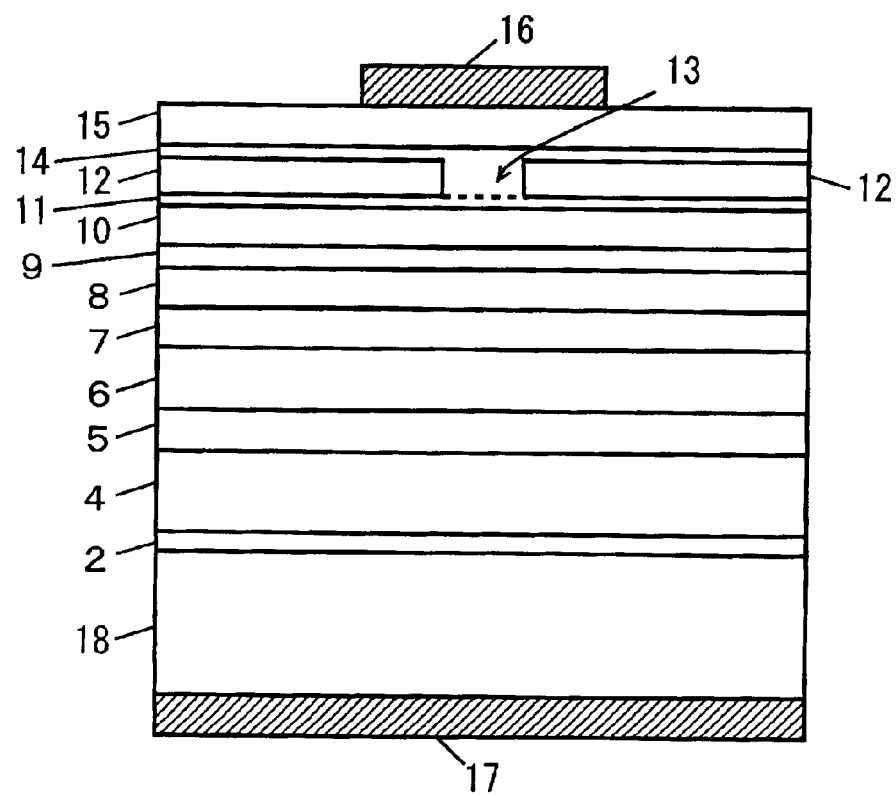
FIG. 8 is a typical sectional view of the GaN based semiconductor laser device according to the sixth embodiment of the present invention.

FIG. 8 is a typical sectional view of a GaN based semiconductor laser device according to a seventh embodiment of the present invention.

As shown in FIG. 8, a buffer layer 2, an n-BGaN layer 4, an n-anti-cracking layer 5, an n-cladding layer 6, an n-light guide layer 7, an n-MQW active layer 8, a p-carrier blocking layer 9, a p-light guide layer 10 and a p-first cladding layer 11 are successively formed on a conductive substrate 18 such as a GaN substrate. An n-current blocking layer 12 having a striped opening 13 is formed on the p-first cladding layer 11. A p-second cladding layer 14 is formed on the p-first cladding layer 11 located in the striped opening 13 and the n-current blocking layer 12. A p-contact layer 15 is formed on the p-second cladding layer 14. A p type electrode 16 is formed on the p-contact layer 15, and an n type electrode 17 is formed on the back surface of the conductive substrate 18. The semiconductor laser device shown in FIG. 8 is provided with no BGaN layer 3, dissimilarly to the semiconductor laser device shown in FIG. 1. Also in the semiconductor laser device shown in FIG. 8, the n-current blocking layer 12 is formed by alternately stacking five n-first current blocking layers 12a of BAlGaN each having a thickness of 0.1 $\mu$m and four n-second current blocking layers 12b of BInGaN each having a thickness of 0.02 $\mu$m as shown in the energy band diagram of FIG. 2, similarly to the semiconductor laser device shown in FIG. 1.

The compositions, thicknesses and growth conditions of the layers 2, 4 to 12, 14 and 15 forming the semiconductor laser device shown in FIG. 8 are similar to those of the layers 2, 4 to 12, 14 and 15 forming the semiconductor laser device shown in FIG. 1.

In the semiconductor laser device according to this embodiment, the n-second current blocking layers 12b of BInGaN having a smaller band gap than the n-first current blocking layers 12a of BAlGaN are held between the n-first current blocking layers 12a for effectively absorbing strain caused in the n-first current blocking layers 12a arranged on both sides thereof, thereby preventing cracking. In particular, the n-second current blocking layers 12b containing indium attain a large anti-cracking effect.

The refractive index of the n-current blocking layer 12 is smaller than those of the p-first cladding layer 11 and the p-second cladding layer 14 so that the effective refractive index in the region of the MQW active layer 8 located under the striped opening 13 is smaller than the refractive index in the region of the MQW active layer 8 located under the n-current blocking layer 12 for increasing an effect of concentrating light to the region located under the striped opening 13.

Further, it is possible to readily control the mean energy level E2 of the n-current blocking layer 12 on the lower end of the conduction band higher than the energy level of the p-first cladding layer 11 and the p-second cladding layer 14 on the lower end of the conduction band by increasing the thickness of the n-first current blocking layers 12a beyond that of the n-second current blocking layers 12b.

(8) Eighth Embodiment

A GaN based semiconductor laser device according to an eighth embodiment of the present invention is now described.

The semiconductor laser device according to this embodiment is similar in structure to the semiconductor laser device shown in FIG. 1 except the materials for respective layers. Table 4 shows the compositions, thicknesses and growth temperatures of the layers forming the semiconductor laser device according to this embodiment.

TABLE 4

| Name of Layer | Composition | Thickness | Growth Temperature [° C.] |
|---|---|---|---|
| Low-Temperature Buffer Layer | $Al_{0.5}Ga_{0.5}N$ | 200Å | 600 |
| i-GaN Layer | GaN | 4.5 $\mu$m | 1080 |
| n-GaN Layer | GaN | 4.5 $\mu$m | 1080 |
| Anti-Cracking Layer | $Al_{0.07}Ga_{0.93}N$/GaN | 0.25 $\mu$m | 1080 |
| n-Cladding Layer | $Al_{0.07}Ga_{0.93}N$ | 0.8 $\mu$m | 1080 |
| n-Light Guide Layer | GaN | 0.1 $\mu$m | 1080 |
| Quantum Barrier Layer | $In_{0.02}Ga_{0.98}N$ | 50Å | 800 |
| Quantum Well Layer | $In_{0.10}Ga_{0.90}N$ | 20Å | 800 |
| p-Carrier Blocking Layer | $Al_{0.2}Ga_{0.8}N$ | 200Å | 800 |
| p-Light Guide Layer | GaN | 0.1 $\mu$m | 1080 |
| p-First Cladding Layer | $Al_{0.07}Ga_{0.93}N$ | 0.2 $\mu$m | 1080 |
| n-First Current Blocking Layer | $Al_{0.09}Ga_{0.91}N$ | 0.1 $\mu$m | 1080 |
| n-Second Current Blocking Layer | $In_{0.05}Ga_{0.95}N$ | 0.02 $\mu$m | 800 |
| p-Second Cladding Layer | $Al_{0.07}Ga_{0.93}N$ | 0.7 $\mu$m | 1080 |
| p-Contact Layer | GaN | 0.05 $\mu$m | 1080 |

As shown in Table 4, a low-temperature buffer layer 2 is made of AlGaN, an undoped GaN layer is provided in place of the BGaN layer 3, and an n-GaN layer is provided in place of the n-BGaN layer 4. An n-anti-cracking layer 5 is formed by alternately stacking 21 pairs of AlGaN layers of 60 Å in thickness and GaN layers of 60 Å in thickness, an n-cladding layer 6 is made of AlGaN, and an n-light guide layer 7 is made of GaN.

An n-MQW active layer 8 is formed by alternately stacking four InGaN quantum barrier layers of 50 Å in thickness and three InGaN quantum well layers of 20 Å in thickness. Further, a p-carrier blocking layer 9 is made of AlGaN, a p-light guide layer 10 is made of GaN, a p-first cladding layer 11 and a p-second cladding layer 14 are made of AlGaN, and a p-contact layer 13 is made of GaN. An n-current blocking layer 12 is formed by alternately stacking five n-first current blocking layers 12a of 0.1 $\mu$m in thickness and four n-second current blocking layers 12b of 0.02 $\mu$m in thickness as shown in the energy band diagram of FIG. 2, while the n-first current blocking layers 12a are made of AlGaN and the n-second current blocking layers 12b are made of InGaN.

TMG, TMA and $NH_3$ are employed as raw material gases for growing the low-temperature buffer layer 2. TMG and $NH_3$ are employed as raw material gases for growing the GaN layer. TMG and $NH_3$ are employed as raw material gases and $SiH_4$ is employed as a dopant gas for growing the n-GaN layer and the n-light guide layer 7. TMG, TMA and $NH_3$ are employed as raw material gases and $SiH_4$ is employed as a dopant gas for growing the n-anti-cracking layer 5, the n-cladding layer 6 and the n-first current blocking layers 12a.

TEG, TMI and NH$_3$ are employed as raw material gases and SiH$_4$ is employed as a dopant gas for growing the n-MQW active layer 8 and the n-second current blocking layers 12b. TMG, TMA and NH$_3$ are employed as raw material gases and Cp$_2$Mg is employed as a dopant gas for growing the p-carrier blocking layer 9, the p-first cladding layer 11 and the p-second cladding layer 14. TMG and NH$_3$ are employed as raw material gases and Cp$_2$Mg is employed as a dopant gas for growing the p-light guide layer 10 and the p-contact layer 15.

The semiconductor laser device according to this embodiment can attain an effect similar to that of the semiconductor laser device shown in FIG. 1.

(9) Ninth Embodiment

A GaN based semiconductor laser device according to a ninth embodiment of the present invention is now described.

The semiconductor laser device according to this embodiment is similar in structure to the semiconductor laser device according to the sixth embodiment except the material and the thickness of an n-current blocking layer 12B. Table 5 shows the compositions, thicknesses and growth temperatures of layers forming the semiconductor laser device according to this embodiment.

TABLE 5

| Name of Layer | Composition | Thickness | Growth Temperature [° C.] |
|---|---|---|---|
| Quantum Barrier Layer | In$_{0.02}$Ga$_{0.98}$N | 50Å | 800 |
| Quantum Well Layer | In$_{0.10}$Ga$_{0.90}$N | 20Å | 800 |
| p-First Cladding Layer | Al$_{0.07}$Ga$_{0.93}$N | 0.2 μm | 1080 |
| n-First Current Blocking Layer | Al$_{0.09}$Ga$_{0.91}$N | 0.1 μm | 1080 |
| n-Second Current Blocking Layer | In$_{0.13}$Ga$_{0.87}$N | 0.01 μm | 800 |
| p-Second Cladding Layer | Al$_{0.07}$Ga$_{0.93}$N | 0.7 μm | 1080 |

The compositions, thicknesses and growth temperatures of the quantum barrier layers, the quantum well layers, the p-first cladding layer 11 and the p-second cladding layer 14 shown in Table 5 are similar to those of the layers forming the semiconductor laser device shown in Table 4.

As shown in the energy band diagram of FIG. 4, the n-current blocking layer 12B of the semiconductor laser device according to this embodiment is formed by stacking five n-first current blocking layers 12e of AlGaN each having a thickness of 0.1 μm and four n-second current blocking layers 12f of BInGaN each having a thickness of 0.01 μm.

The semiconductor laser device according to this embodiment can attain an effect similar to that of the semiconductor laser device shown in FIG. 4.

(10) Tenth Embodiment

A GaN based semiconductor laser device according to a tenth embodiment of the present invention is now described.

The semiconductor laser device according to this embodiment is similar in structure to the semiconductor laser device according to the eighth embodiment except the material and the thickness of an n-current blocking layer 12D. Table 6 shows the compositions, thicknesses and growth temperatures of layers forming the semiconductor laser device according to this embodiment.

TABLE 6

| Name of Layer | Composition | Thickness | Growth Temperature [° C.] |
|---|---|---|---|
| Quantum Barrier Layer | In$_{0.02}$Ga$_{0.98}$N | 50Å | 800 |
| Quantum Well Layer | In$_{0.10}$Ga$_{0.90}$N | 20Å | 800 |
| p-First Cladding Layer | Al$_{0.07}$Ga$_{0.93}$N | 0.2 μm | 1080 |
| n-First Current Blocking Layer | Al$_{0.04}$In$_{0.08}$Ga$_{0.88}$N | 0.1 μm | 800 |
| n-Second Current Blocking Layer | In$_{0.15}$Ga$_{0.85}$N | 0.01 μm | 800 |
| p-Second Cladding Layer | Al$_{0.07}$Ga$_{0.93}$N | 0.7 μm | 1080 |

The compositions, thicknesses and growth temperatures of the quantum barrier layers, the quantum well layers, the p-first cladding layer 11 and the p-second cladding layer 14 shown in Table 6 are similar to those of the layers forming the semiconductor laser device shown in Table 4.

As shown in the energy band diagram of FIG. 6, the n-current blocking layer 12D of the semiconductor laser device according to this embodiment is formed by alternately stacking five n-first current blocking layers 12i of AlInGaN each having a thickness of 0.1 μm and four n-second current blocking layers 12k of InGaN each having a thickness of 0.01 μm.

The semiconductor laser device according to this embodiment can attain an effect similar to that of the semiconductor laser device shown in FIG. 6.

(11) Eleventh Embodiment

Figure 9:
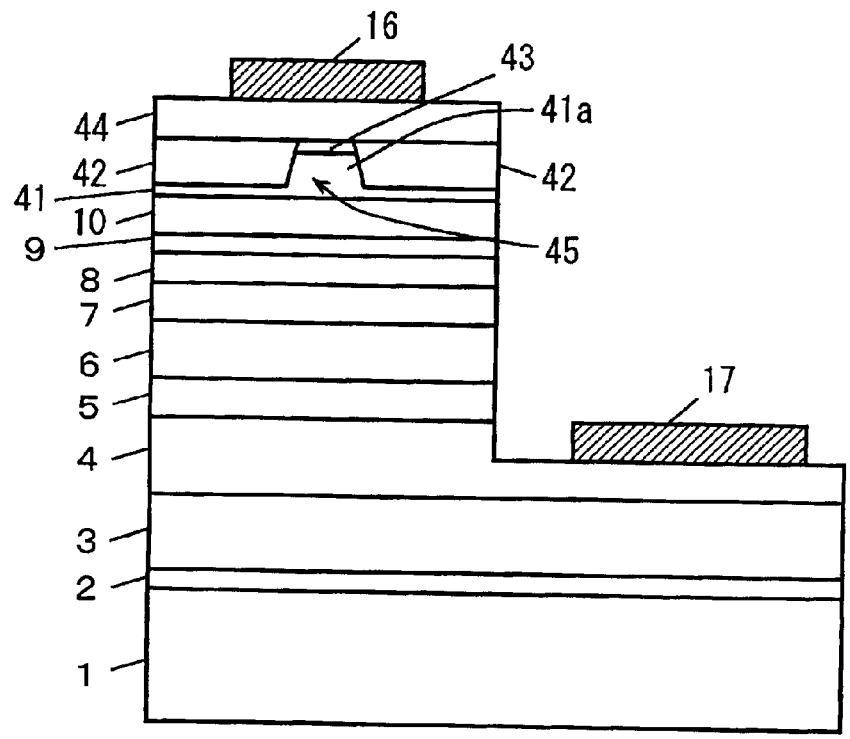
FIG. 9 is a typical sectional view of a GaN based semiconductor laser device according to an eleventh embodiment of the present invention.
Figure 10:
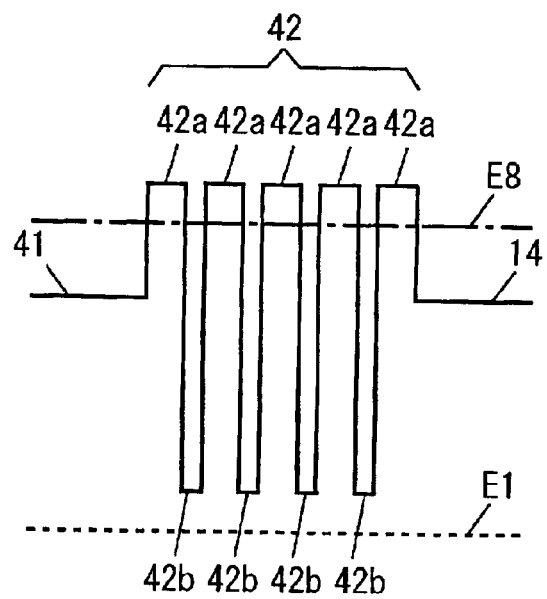
FIG. 10 is an energy band diagram of a current blocking layer of the semiconductor laser device shown in FIG. 9 and the vicinity thereof.

FIG. 9 is a typical sectional view of a GaN based semiconductor laser device according to an eleventh embodiment of the present invention. FIG. 10 is an energy band diagram of an n-current blocking layer 42 of the semiconductor laser device shown in FIG. 9 and the vicinity thereof. The semiconductor laser device shown in FIG. 9 has a striped ridge part 41a in a p-cladding layer 41.

Layers from a sapphire substrate 1 to a p-light guide layer 10 forming the semiconductor laser device according to this embodiment are similar in structure to the layers forming the semiconductor laser device shown in FIG. 1. The n-current blocking layer 42 of the semiconductor laser device according to this embodiment is similar to the n-current blocking layer 12 shown in FIG. 1, except the sectional shape of a striped opening 45 in a direction perpendicular to the longitudinal direction thereof. Table 7 shows the compositions, thicknesses and growth temperatures of the layers formed on the p-light guide layers 10 of the semiconductor laser device according to this embodiment.

TABLE 7

| Name of Layer | Composition | Thickness | Growth Temperature [° C.] |
|---|---|---|---|
| p-Cladding Layer | B$_{0.02}$Al$_{0.05}$Ga$_{0.93}$N | 0.2 μm | 1080 |
| n-First Current Blocking Layer | B$_{0.02}$Al$_{0.07}$Ga$_{0.91}$N | 0.1 μm | 1080 |
| n-Second Current Blocking Layer | B$_{0.02}$In$_{0.08}$Ga$_{0.90}$N | 0.02 μm | 800 |
| p-Cap Layer | B$_{0.02}$Ga$_{0.98}$N | 0.1 μm | 1080 |
| p-Contact Layer | B$_{0.02}$Ga$_{0.98}$N | 0.05 μm | 1080 |

As shown in Table 7, the p-cladding layer 41 of BAlGaN having the ridge part 41a is provided on the p-light guide layer 10 of BGaN. The thickness of the p-cladding layer 41 excluding the region of the ridge part 41a is 0.2 μm. A p-cap layer 43 of BGaN is formed on the ridge part 41a of the p-cladding layer 41, and the n-current blocking layer 42 is provided on portions of the p-cladding layer 41 located on both sides of the ridge part 41a. A p-contact layer 44 of BGaN is provided on the n-current blocking layer 42 and the p-cap layer 43. In the p-cladding layer 41, the ridge part 41a corresponds to a p-second cladding layer, and the remaining part corresponds to a p-first cladding layer.

Similarly to the semiconductor laser device shown in FIG. 1, the n-current blocking layer 42 is formed by alternately stacking five n-first current blocking layers 42a of BAlGaN each having a thickness of 0.1 μm and four n-second current blocking layers 42b of BInGaN each having a thickness of 0.02 μm, as shown in FIG. 10.

TMG, TMA, $NH_3$ and $B_2H_4$ are employed as raw material gases and $Cp_2Mg$ is employed as a dopant gas for growing the p-BAlGaN cladding layer 41. TMG, $NH_3$ and $B_2H_4$ are employed as raw material gases and $Cp_2Mg$ is employed as a dopant gas for growing the p-BGaN cap layer 43 and the p-BGaN contact layer 44. TMG, TMA, $NH_3$ and $B_2H_4$ are employed as raw material gases and $SiH_4$ is employed as a dopant gas for growing the n-first current blocking layers 42a. TEG, TMI, $NH_3$ and $B_2H_4$ are employed as raw material gases and $SiH_4$ is employed as a dopant gas for growing the n-second current blocking layers 42b.

The semiconductor laser device according to this embodiment can attain an effect similar to that of the semiconductor laser device shown in FIG. 1.

While the five n-first current blocking layers 42a and the four n-second current blocking layers 42b are alternately stacked in the eleventh embodiment, the numbers of the stacked n-first current blocking layers and n-second current blocking layers are not restricted to the above. At least two n-first current blocking layers and at least one second current blocking layer may be alternately stacked. Thus, the n-first current blocking layers hold the n-second current blocking layer(s) therebetween, so that the n-second current blocking layer(s) can effectively absorb strain of the n-first current blocking layers caused on both sides thereof.

While the band gap of the n-second current blocking layers 42b of BInGaN is larger than the band gap of quantum well layers forming an MQW active layer 8 in the eleventh embodiment, the band gap of the n-second current blocking layers may be rendered smaller than that of the quantum well layers by increasing the composition ratio of indium so that the composition of the n-second current blocking layers is $B_{0.02}In_{0.15}Ga_{0.83}N$, for example.

While the mean refractive index of the n-current blocking layer 42 is set smaller than the refractive index of the p-cladding layer 41 of BAlGaN to provide a real refractive index guided structure in the aforementioned eleventh embodiment, the mean band gap of the n-current blocking layer may be rendered smaller than that of the MQW active layer 8, for obtaining a semiconductor laser device having a loss guided structure similarly to the semiconductor laser device shown in FIG. 6 in this case.

(12) Twelfth Embodiment

A semiconductor laser device according to a twelfth embodiment of the present invention is now described.

A typical sectional structure of the semiconductor laser device according to this embodiment is similar to that of the semiconductor laser device according to the eleventh embodiment shown in FIG. 9. However, the materials for layers forming the semiconductor laser device according to this embodiment are different from those forming the layers of the semiconductor laser device according to the eleventh embodiment. The respective layers from a sapphire substrate 1 to a p-light guide layer 10 forming the semiconductor laser device according to this embodiment are identical to the layers forming the semiconductor layer according to the eighth embodiment shown in Table 4. Table 8 shows the compositions, thicknesses and growth temperatures of layers formed on the p-light guide layer 10 of the semiconductor laser device according to this embodiment.

TABLE 8

| Name of Layer | Composition | Thickness | Growth Temperature [° C.] |
| --- | --- | --- | --- |
| p-Cladding Layer | $Al_{0.07}Ga_{0.93}N$ | 0.2 μm | 1080 |
| n-First Current Blocking Layer | $Al_{0.09}Ga_{0.91}N$ | 0.1 μm | 1080 |
| n-Second Current Blocking Layer | $In_{0.05}Ga_{0.95}N$ | 0.02 μm | 800 |
| p-Cap Layer | GaN | 0.1 μm | 1080 |
| p-Contact Layer | GaN | 0.05 μm | 1080 |

A p-cladding layer 41 formed on the p-GaN light guide layer 10 is made of AlGaN and has a thickness of 0.2 μm except the region of a ridge part 41a. A p-cap layer 43 is made of GaN and has a thickness of 0.1 μm. An n-current blocking layer 42 is formed by alternately stacking five n-first current blocking layers 42a of AlGaN each having a thickness of 0.1 μm and four n-second current blocking layers 42b of InGaN each having a thickness of 0.02 μm, as shown in FIG. 10. A contact layer 44 of GaN having a thickness of 0.05 μm is formed on the n-current blocking layer 42 and the p-cap layer 43.

TMG, TMA, $NH_3$ and $B_2H_4$ are employed as raw material gases and $Cp_2Mg$ is employed as a dopant gas for growing the p-cladding layer 41. TMG, $NH_3$ and $B_2H_4$ are employed as raw material gases and $Cp_2Mg$ is employed as a dopant gas for growing the p-cap layer 43 and the p-contact layer 44. TMG, TMA and $NH_3$ are employed as raw material gases and $SiH_4$ is employed as a dopant gas for growing the n-first current blocking layers 42a. TEG, TMI and $NH_3$ are employed as raw material gases and $SiH_4$ is employed as a dopant gas for growing the n-second current blocking layers 42b.

The semiconductor laser device according to this embodiment can attain an effect similar to that of the semiconductor laser device according to the eighth embodiment.

While the five n-first current blocking layers 42a and the four n-second current blocking layers 42b are alternately stacked in the twelfth embodiment, the numbers of the stacked n-first current blocking layers and n-second current blocking layers are not restricted to the above. At least two n-first current blocking layers and at least one second current blocking layer may be alternately stacked. Thus, the n-first current blocking layers hold the n-second current blocking layer(s) therebetween, so that the n-second current blocking layer(s) can effectively absorb strain of the n-first current blocking layers caused on both sides thereof.

While the band gap of the n-second current blocking layers 42b of InGaN is larger than the band gap of quantum well layers forming an MQW active layer 8 in the twelfth embodiment, the band gap of the n-second current blocking layers may be rendered smaller than that of the quantum well layers by increasing the composition ratio of indium so that the composition of the second current blocking layers is $In_{0.15}Ga_{0.85}N$, for example.

While the mean refractive index of the n-current blocking layer 42 is set smaller than the refractive index of the p-cladding layer 41 of AlGaN to provide a real refractive index guided structure in the aforementioned twelfth embodiment, the mean band gap of the n-current blocking layer may be rendered smaller than that of the MQW active layer 8, for obtaining a semiconductor laser device having a loss guided structure similarly to the semiconductor laser device according to the tenth embodiment in this case.

(13) Thirteenth Embodiment

Figure 11:
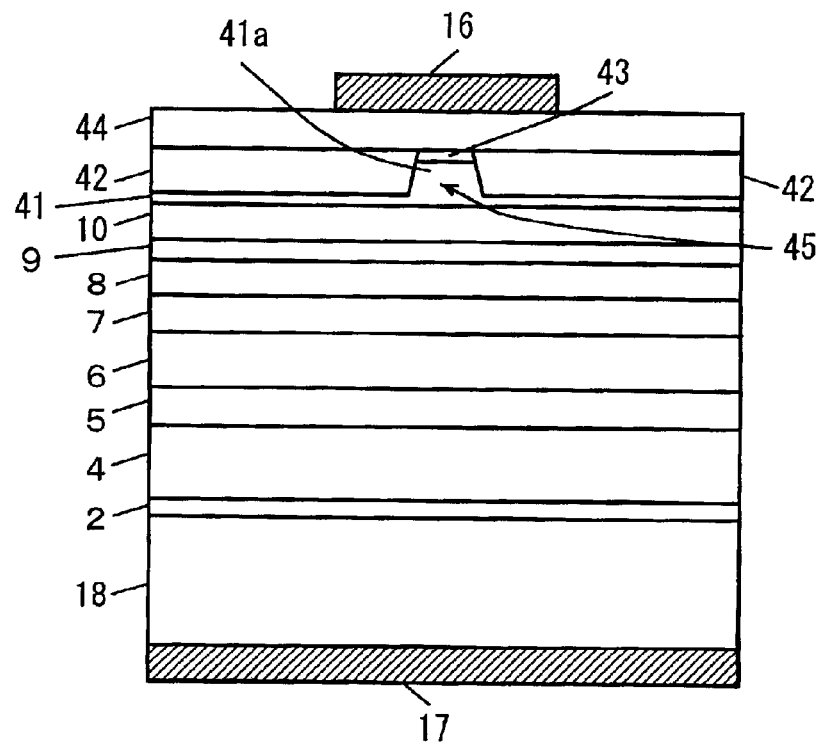
FIG. 11 is a typical sectional view of a GaN based semiconductor laser device according to a thirteenth embodiment of the present invention.
Figure 12:
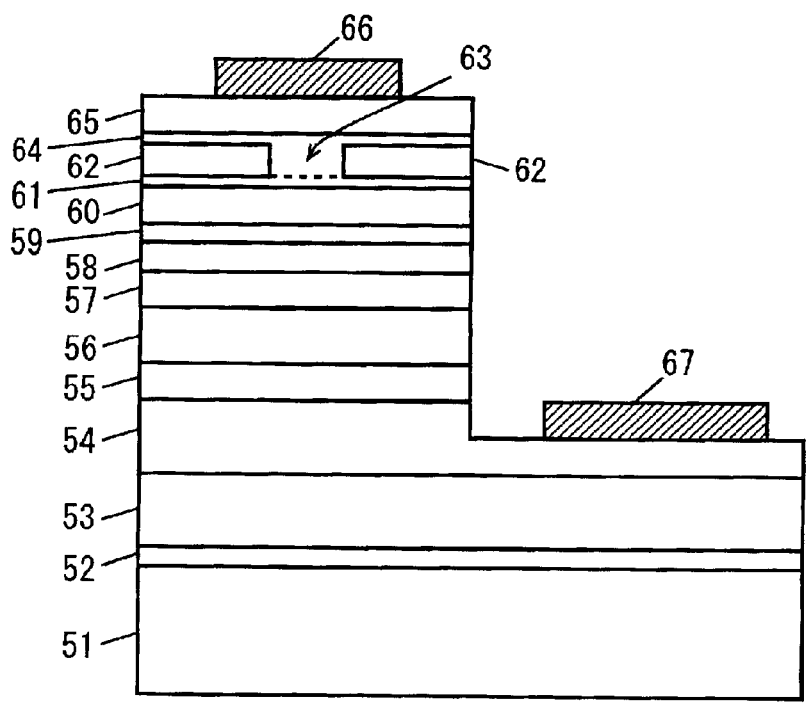
FIG. 12 is a typical sectional view of a conventional GaN based semiconductor laser device.

FIG. 11 is a typical sectional view of a GaN based semiconductor laser device according to a thirteenth embodiment of the present invention.

As shown in FIG. 11, a buffer layer 2, an n-BGaN layer 4, an n-anti-cracking layer 5, an n-cladding layer 6, an n-light guide layer 7, an n-MQW active layer 8, a p-carrier blocking layer 9, a p-light guide layer 10 and a p-cladding layer 41 are successively formed on a conductive substrate 18 such as a GaN substrate. A striped ridge part 41a is formed in the p-cladding layer 41. An n-current blocking layer 42 is formed on parts of the p-cladding layer 41 located on both sides of the striped ridge part 41a. A p-cap layer 43 is formed on the striped ridge part 41a. A p-contact layer 44 is formed on the n-current blocking layer 42 and the p-cap layer 43. A p type electrode 16 is formed on the p-contact layer 44, and an n type electrode 17 is formed on the back surface of the conductive substrate 18. The semiconductor laser device shown in FIG. 11 is provided with no BGaN layer 3, dissimilarly to the semiconductor laser device shown in FIG. 9.

The compositions, thicknesses and growth conditions of the layers 2, 4 to 10 and 41 to 44 forming the semiconductor laser device shown in FIG. 11 are similar to those of the layers 2, 4 to 10 and 41 to 44 forming the semiconductor laser device shown in FIG. 9. Also in the semiconductor laser device shown in FIG. 11, the n-current blocking layer 42 is formed by alternately stacking five n-first current blocking layers 42a of 0.1 μm in thickness and four n-second current blocking layers 42b of 0.02 μm in thickness as shown in the energy band diagram of FIG. 10, similarly to the semiconductor laser device shown in FIG. 9. The first current blocking layers 42a are made of AlGaN, and the n-second current blocking layers 42b are made of InGaN.

In the semiconductor laser device according to this embodiment, the n-second current blocking layers 42b of InGaN having a smaller band gap than the n-first current blocking layers 42a of AlGaN are held between the n-first current blocking layers 42a to effectively absorb strain caused in the n-first current blocking layers 42a located on both sides thereof, so that cracking is hardly caused. In particular, the n-second current blocking layers 42b contain indium, to attain a large anti-cracking effect.

The refractive index of the n-current blocking layer 42 is smaller than that of the p-cladding layer 14 so that the effective refractive index in the region of the MQW active layer 8 located under a striped opening 45 is smaller than the effective refractive index of the MQW active layer 8 located under the n-current blocking layer 42 for increasing an effect of concentrating light to the region located under the striped opening 45. Thus, a semiconductor laser device of a real refractive index guided structure is implemented.

Further, it is possible to readily control the mean energy level E8 of the n-current blocking layer 42 on the lower end of the conduction band higher than the energy level of the p-cladding layer 41 on the lower end of the conduction band by increasing the thickness of the n-first current blocking layers 42a beyond that of the n-second current blocking layers 42b.

While the five n-first current blocking layers 42a and the four n-second current blocking layers 42b are alternately stacked in the thirteenth embodiment, the numbers of the stacked n-first current blocking layers and n-second current blocking layers are not restricted to the above. At least two n-first current blocking layers and at least one second current blocking layer may be alternately stacked. Thus, the n-first current blocking layers hold the n-second current blocking layer(s) therebetween, so that the n-second current blocking layer(s) can effectively absorb strain of the n-first current blocking layers caused on both sides thereof.

While the band gap of the n-second current blocking layers 42b is larger than the band gap of quantum well layers forming the MQW active layer 8 in the thirteenth embodiment, the band gap of the n-second current blocking layers may be rendered smaller than that of the quantum well layers by increasing the composition ratio of indium so that the composition of the n-second current blocking layers is $In_{0.15}Ga_{0.85}N$, for example.

While the mean refractive index of the n-current blocking layer 42 is set smaller than the refractive index of the p-cladding layer 41 of AlGaN to provide a real refractive index guided structure in the aforementioned thirteenth embodiment, the mean band gap of the n-current blocking layer may be rendered smaller than the band gap of the MQW active layer 8, for obtaining a semiconductor laser device having a loss guided structure similarly to the semiconductor laser device according to the tenth embodiment in this case.

The compositions and thicknesses of the n-first current blocking layers 12a, 12c, 12e, 12g, 12i and 42a, which are first layers, and the n-second current blocking layers 12b, 12d, 12f, 12h, 12k and 42b, which are second layers, are not restricted to those of the aforementioned embodiments, so far as the first layers are made of a nitride based semiconductor containing at least one of aluminum and boron, the second layers are made of a nitride based semiconductor containing indium and the band gap of the second layers is smaller than that of the first layers.

The compositions of the p-first cladding layers 11 and 41 and the p-second cladding layers 14 and 41a may be different from each other.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device comprising:
   a first nitride based semiconductor layer including a first conductivity type cladding layer and an active layer and containing at least one of boron, aluminum, gallium, indium and thallium;
   a current blocking layer, formed on said first nitride based semiconductor layer, having a striped opening; and
   a second nitride based semiconductor layer, formed on said first nitride based semiconductor layer in said striped opening, including a second conductivity type second cladding layer and containing at least one of boron, aluminum, gallium, indium and thallium, wherein
   said current blocking layer includes a multilayer structure of at least one first layer of a nitride based semiconductor containing at least one of aluminum and boron and at least one second layer of a nitride based semiconductor containing indium and having a smaller band gap than said first layer.

2. The semiconductor laser device according to claim 1, wherein said at least one first layer of a nitride based semiconductor has a larger aluminum composition ratio than that of said at least one second layer of a nitride based semiconductor or a larger boron composition ratio than that of said at least one second layer of a nitride based semiconductor, and said at least one second layer of a nitride based semiconductor has a larger indium composition ratio than that of said at least one first layer of a nitride based semiconductor.

3. The semiconductor laser device according to claim 1, wherein said first nitride based semiconductor layer further includes said second conductivity type first cladding layer provided between said active layer and said second conductivity type second cladding layer in said nitride based semiconductor layer.

4. The semiconductor laser device according to claim 1, wherein said at least one first layer includes at least two first layers, and said at least two first layers and said at least one second layer are alternately stacked.

5. The semiconductor laser device according to claim 1, wherein the mean refractive index of said current blocking layer is smaller than the refractive index of said second nitride based semiconductor layer in said striped opening.

6. The semiconductor laser device according to claim 5, wherein the thickness of each of said at least one first layer is larger than the thickness of each of said at least one second layer.

7. The semiconductor laser device according to claim 3, wherein the mean band gap of said current blocking layer is larger than the band gap of said second conductivity type second cladding layer.

8. The semiconductor laser device according to claim 7, wherein said active layer includes at least one quantum well layer and at least two quantum barrier layers alternately stacked, and the band gap of said at least one second layer is larger than the band gap of said at least one quantum well layer.

9. The semiconductor laser device according to claim 3, wherein said active layer contains indium, gallium and nitrogen, said at least one first layer contains at least one of aluminum and boron as well as gallium and nitrogen, said at least one second layer contains indium, gallium and nitrogen, and said first conductivity type cladding layer, said second conductivity type first cladding layer and said second conductivity type second cladding layer contain aluminum, gallium and nitrogen.

10. The semiconductor laser device according to claim 9, wherein said at least one first layer has a larger aluminum composition ratio than that of said second conductivity type second cladding layer or a larger boron composition ratio than that of said second conductivity type second cladding layer.

11. The semiconductor laser device according to claim 9, wherein said active layer includes at least one quantum well layer containing indium, gallium and nitrogen and at least two quantum barrier layers containing indium, gallium and nitrogen, alternately stacked, and the indium composition ratio of said at least one quantum well layer is larger than the indium composition ratio of said at least two quantum barrier layers.

12. The semiconductor laser device according to claim 1, wherein the mean band gap of said current blocking layer is substantially equal to or smaller than the band gap of said active layer.

13. The semiconductor laser device according to claim 12, wherein said active layer includes at least one quantum well layer and at least two quantum barrier layers alternately stacked, and the mean band gap of said current blocking layer is substantially equal to or smaller than the mean band gap of said active layer.

14. The semiconductor laser device according to claim 13, wherein the band gap of said at least one second layer is smaller than the band gap of said at least one quantum well layer.

15. The semiconductor laser device according to claim 14, wherein said active layer contains indium, gallium and nitrogen, said at least one first layer contains at least one of aluminum and boron as well as indium, gallium and nitrogen, said at least one second layer contains indium, gallium and nitrogen, and said first conductivity type cladding layer, said second conductivity type first cladding layer and said second conductivity type second cladding layer contain aluminum, gallium and nitrogen.

16. The semiconductor laser device according to claim 15, wherein said active layer includes at least one quantum well layer containing indium, gallium and nitrogen and at least two quantum barrier layers containing indium, gallium and nitrogen, alternately stacked, and the indium composition ratio of said at least one quantum well layer is larger than the indium composition ratio of said at least two quantum barrier layers.

17. The semiconductor laser device according to claim 3, wherein said first nitride based semiconductor layer further includes a first conductivity type light guide layer provided between said first conductivity type cladding layer and said active layer and a second conductivity type light guide layer provided between said active layer and said second conductivity type first cladding layer.

18. The semiconductor laser device according to claim 3, further comprising:

a third nitride based semiconductor layer, formed on said current blocking layer and said second nitride based semiconductor layer, containing at least one of boron, aluminum, gallium, indium and thallium.

* * * * *